United States Patent
Prosyentsov et al.

(10) Patent No.: US 9,958,788 B2
(45) Date of Patent: May 1, 2018

(54) METHOD OF OPERATING A PATTERNING DEVICE AND LITHOGRAPHIC APPARATUS

(71) Applicant: ASML NETHERLANDS B.V., Veldhoven (NL)

(72) Inventors: Vitaliy Prosyentsov, Deurne (NL); Willem Jurrianus Venema, Eindhoven (NL); Kars Zeger Troost, Waalre (NL); Adrianus Martinus Van Der Wielen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days. days.

(21) Appl. No.: 15/405,009

(22) Filed: Jan. 12, 2017

(65) Prior Publication Data
US 2017/0123323 A1    May 4, 2017

Related U.S. Application Data

(63) Continuation of application No. 14/512,120, filed on Oct. 10, 2014, now Pat. No. 9,568,833, which is a (Continued)

(51) Int. Cl.
*G03B 27/42* (2006.01)
*G03F 7/20* (2006.01)
*G03F 1/44* (2012.01)

(52) U.S. Cl.
CPC ............ *G03F 7/705* (2013.01); *G03F 1/44* (2013.01); *G03F 7/70133* (2013.01); *G03F 7/70783* (2013.01); *G03F 7/70875* (2013.01)

(58) Field of Classification Search
CPC ............ G03F 7/70875; G03F 7/70783; G03F 7/70258; G03F 7/70858; H01L 21/67098; H01L 21/67103; G02B 7/1815
See application file for complete search history.

(56) References Cited

U.S. PATENT DOCUMENTS

| | | | |
|---|---|---|---|
| 5,581,324 A | 12/1996 | Miyai et al. | |
| 6,277,532 B1 | 8/2001 | Yahiro | |

(Continued)

FOREIGN PATENT DOCUMENTS

| | | |
|---|---|---|
| CN | 1519651 A | 8/2004 |
| CN | 1794089 A | 6/2006 |

(Continued)

OTHER PUBLICATIONS

Zheng G. Chen et al., "Optical Error Sensitivities of Immersion Lithography," Proc. of SPIE, vol. 6520, pp. 652013-1-652013-11 (2007).

(Continued)

*Primary Examiner* — Mesfin Asfaw
(74) *Attorney, Agent, or Firm* — Pillsbury Winthrop Shaw Pittman LLP

(57) ABSTRACT

A lithographic reticle is illuminated to transfer a pattern to a substrate, inducing distortions due to heating. The distortions are calculated using reference marks in a peripheral portion of the reticle and measuring changes in their relative positions over time. A plurality of cells are defined for which a system of equations can be solved to calculate a dilation of each cell. In an embodiment, each equation relates positions of pairs of marks to dilations of the cells along a fine (s, s1, s2) connecting each pair. Local positional deviations can be calculated for a position by combining calculated dilations for cells between at least one measured peripheral mark and the position. Corrections can be applied in accordance with the result of the calculation. Energy may be applied to the patterning device (for example by thermal input or mechanical actuators) to modify a distribution of the local positional deviations.

20 Claims, 7 Drawing Sheets

Related U.S. Application Data continuation of application No. 13/306,728, filed on Nov. 29, 2011, now Pat. No. 9,417,533.

(60) Provisional application No. 61/418,154, filed on Nov. 30, 2010.

(56) References Cited

U.S. PATENT DOCUMENTS

| | | |
|---|---|---|
| 6,635,549 B2 | 10/2003 | Kyoh et al. |
| 7,158,210 B2 | 1/2007 | Iizuka et al. |
| 7,271,907 B2 | 9/2007 | Van Bilsen |
| 7,462,429 B2 | 12/2008 | Menchtchikov et al. |
| 7,683,351 B2 | 3/2010 | Mos et al. |
| 2002/0037625 A1 | 3/2002 | Kyoh et al. |
| 2002/0053644 A1 | 5/2002 | Yonekawa |
| 2004/0150805 A1 | 8/2004 | Iizuka et al. |
| 2005/0118514 A1 | 6/2005 | Tsai |
| 2006/0209284 A1 | 9/2006 | Kobayashi |
| 2006/0238728 A1 | 10/2006 | Berman et al. |
| 2007/0082280 A1 | 4/2007 | Menchtchikov et al. |
| 2007/0212648 A1 | 9/2007 | Lalbahadoersing et al. |
| 2007/0273851 A1 | 11/2007 | Finders et al. |
| 2011/0043780 A1 | 2/2011 | Corbeij et al. |

FOREIGN PATENT DOCUMENTS

| | | |
|---|---|---|
| CN | 1928722 A | 3/2007 |
| CN | 101034254 A | 9/2007 |
| CN | 101561633 A | 10/2009 |
| JP | 10-135119 | 5/1998 |
| JP | 10-163082 | 6/1998 |
| JP | 10-242046 | 9/1998 |
| JP | 2002-359178 | 12/2002 |
| JP | 2003-142365 | 5/2003 |
| JP | 2003-156860 | 5/2003 |
| JP | 2004-165250 | 6/2004 |
| TW | 200731334 | 8/2007 |
| TW | 200942997 | 10/2009 |

OTHER PUBLICATIONS

Japanese Office Action dated Dec. 19, 2012 in corresponding Japanese Patent Application No. 2011-255744,.

Korean Office Action dated Mar. 20, 2013 in corresponding Korean Patent Application No. 10-2011-0126756.

Chinese Office Action dated May 15, 2013 in corresponding Chinese Patent Application No. 201110373265.2.

Chinese Office Action dated Jan. 20, 2014 in corresponding Chinese Patent Application No. 201110373265.2.

Boris Menchtchikov et al., U.S. Appl. No. 61/306,035, filed Feb. 19, 2010.

U.S. Office Action dated Dec. 11, 2014 in corresponding U.S. Appl. No. 13/306,728.

U.S. Office Action dated May 15, 2015 in corresponding U.S. Appl. No. 13/306,728.

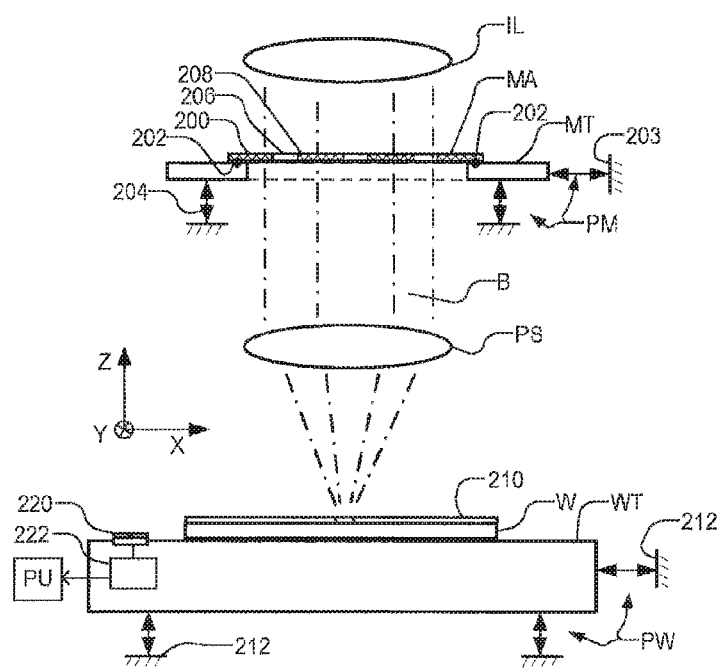
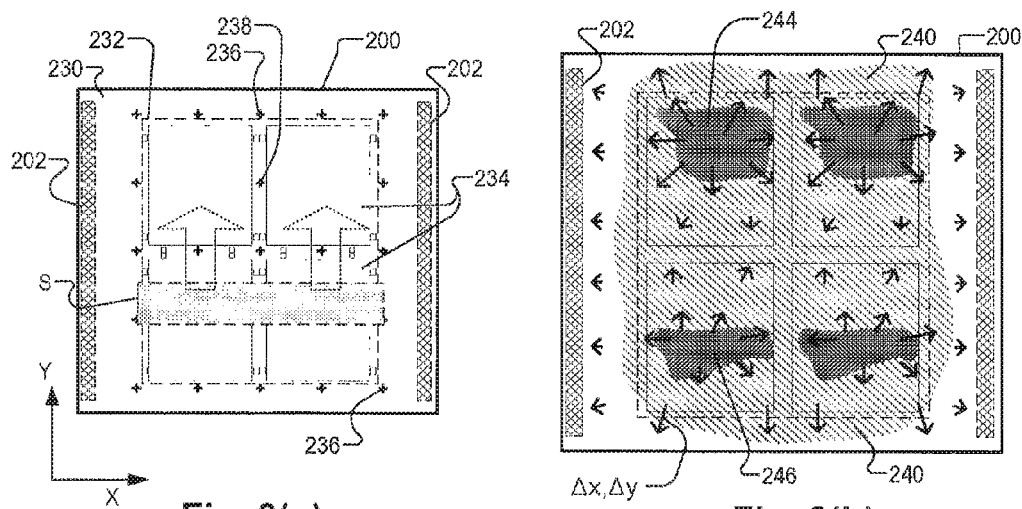
Fig. 2
Fig. 3(a)    Fig. 3(b)

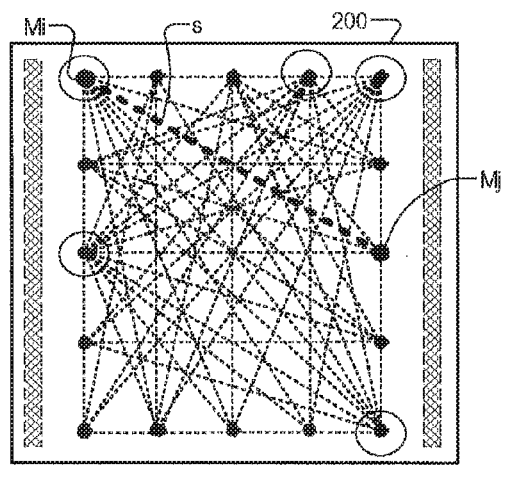 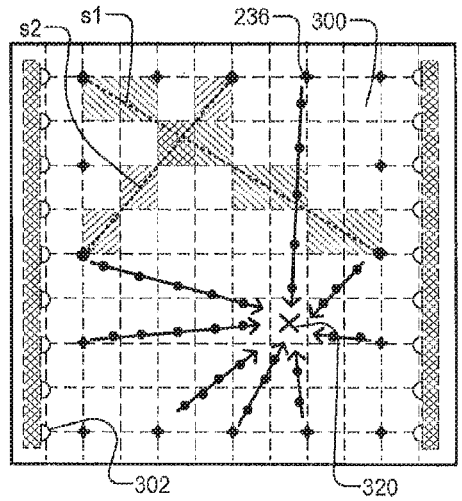
Fig. 4(a)  Fig. 4(b)
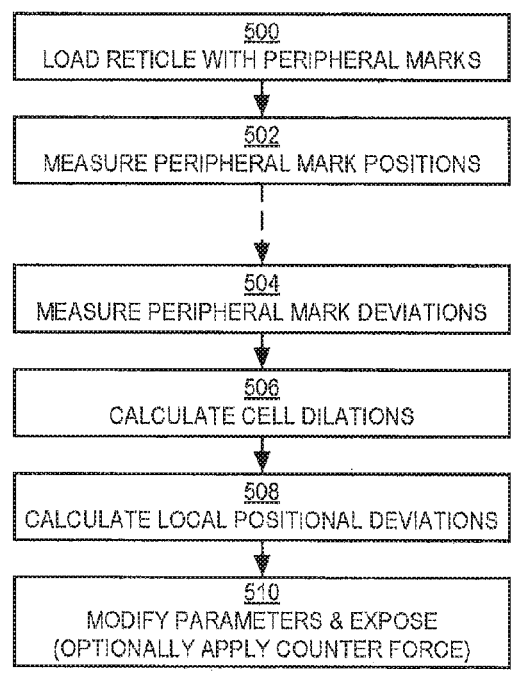
Fig. 5

METHOD OF OPERATING A PATTERNING DEVICE AND LITHOGRAPHIC APPARATUS

This application is a continuation of U.S. patent application Ser. No. 14/512,120, filed on Oct. 10, 2014, which is a continuation of U.S. patent application Ser. No. 13/306,728, filed on Nov. 29, 2011, now U.S. Pat. No. 9,417,533, which claims priority and benefit under 35 U.S.C. § 119(e) to U.S. Provisional Patent Application No. 61/418,154, filed on Nov. 30, 2010. The content of each of the foregoing applications is incorporated herein in its entirety by reference.

FIELD

The present invention relates to a method of operating a patterning device such as a lithographic mask or reticle. The invention further relates to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A key performance parameter of any lithographic process, particularly one used for the manufacture of semiconductor devices, is the so-called overlay. Overlay is the accuracy (or the error) to which features in an applied pattern can be positioned directly on top of cooperating features applied to the same substrate in an earlier step. Modern lithographic processes may apply many measurements, modeling and correction steps to eliminate sources of error in the positioning of features, to achieve overlay of only a few nanometers. As the performance of lithographic apparatuses improves, reticle deformations, caused by for example clamping stresses, sagging, and reticle heating during exposures, are becoming a limiting factor for overlay improvements.

Reticle deformations due to clamping are kept as small as possible, by the clamping design. A U.S. Pat. No. 6,277,532 describes methods for mapping distortions of a pattern across a reticle, and subsequently correcting these for distortions induced by clamping. In another development, focus deviations due to non-flatness of the reticle (deformation in the Z direction) are compensated with Reticle Shape Correction (RSC). RSC is described for example by Z. G. Chen, K. Lai, K. Racette in "Optical error sensitivities of immersion lithography" Proc. SPIE volume 6250, SPIE CID number 652013. RSC uses additional marks to measure Z position at several points along each side of the image field. Low-order nonlinear height deviation of the reticle surface can be corrected. However, when reticle heating is taken into account, the effect of thermal stresses on the distortion of the pattern in the plane of the reticle (X- and Y-directions) becomes significant, causing non-uniform and non-linear movements of different portions within the pattern. Known processes do not provide for the measurement, let alone the correction of such in-plane distortion. To include additional marks over the reticle would impinge upon the product pattern itself and create problems for product designers. The time required to measure additional marks across the pattern would also tend to reduce throughput of the lithographic apparatus.

Accordingly, although some modern lithographic apparatuses have correction mechanisms (in software) that could be applied to compensate for higher-order distortions in the plane of the reticle, the means to measure those distortions is not readily available. It is considered to provide sensors to remotely sense the actual temperature across the reticle, and to estimate the consequent distortions so that they may be corrected. This generally requires additional sensors and space in the apparatus housing, however.

SUMMARY

An aspect of the invention relates to enabling measurement of local distortions across a patterning device such as a reticle, balanced against impact on throughput and cost of the apparatus.

According to a first aspect of the invention, there is provided a method of operating a patterning device, the patterning device having a patterned portion which in operation is illuminated with a radiation beam so as to impart a pattern to the radiation beam in its cross-section, the method comprising:

(a) providing a plurality of reference marks distributed around the patterned portion in a peripheral portion of the patterning device and measuring positions of said marks relative to one another;

(b) after a period of operation of the patterning device, measuring again the positions of said peripheral marks;

(c) by reference to the measured positions of the peripheral marks, calculating local positional deviations induced by thermal heating of the patterning device by said radiation beam at one or more positions of interest within the patterned portion of the patterning device.

By this method, time-varying positional deviations within the patterned portion of the patterning device can be monitored without the measurement of marks within the patterned portion.

In an embodiment, calculation step (c) is performed by defining a plurality of sub-areas within said patterned portion. A system of equations can be solved to calculate a dilation of each sub-area, each equation relating measured positional deviations of marks at the ends of a line crossing the patterned portions to dilations of the sub-areas positioned along said line. The local positional deviations at a position of interest can be calculated by combining calculated dilations for sub-areas between at least one measured peripheral mark and the position of interest.

The method may be applied to exposure operations in a lithographic process. In such an application, parameters of the exposure operations can be modified in accordance with the result of the calculation, in order to reduce overlay error between the applied pattern and a pattern existing on the substrate. Alternatively or in addition, energy may be applied to the patterning device (for example by thermal input or mechanical actuators) to reduce or modify a distribution of the local positional deviations for subsequent exposures.

The invention in a second aspect provides a lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and a controller arranged to control movements of said substrate table, and said patterning device relative to one another and to said projection system in order to perform a succession of exposure operations, each exposure operation applying the pattern to a target portion on the substrate, wherein the controller is arranged before and after a number of exposure operations to measure the relative positions of a plurality of reference marks distributed in a peripheral portion of the patterning device and from said measurements of the peripheral marks to estimate local positional deviations induced by thermal heating of the patterning device by said radiation beam at one or more positions of interest within the patterned portion of the patterning device, and to modify one or more parameters of subsequent exposure operations in accordance with the estimated positional deviation.

The invention in a third aspect provides a method of manufacturing devices by applying a pattern from a patterning device to a series of substrates, the method comprising:

providing a patterning device having a patterned portion; and in an exposure operation illuminating said patterned portion with a radiation beam so as to impart the pattern to the radiation beam in its cross-section and exposing a target portion of a substrate to said patterned radiation beam so as to apply a pattern from the patterning device to the substrate by a lithographic process;

repeating said exposure operation to apply the pattern to target portions on a succession of substrates; and calculating local positional deviations induced by thermal heating of the patterning device by said radiation beam at one or more positions of interest within the patterned portion of the patterning device by:

(a) providing a plurality of reference marks distributed around the patterned portion in a peripheral portion of the patterning device and measuring positions of said marks relative to one another;

(b) after a period of operation of the patterning device, measuring again the positions of said peripheral marks;

(c) by reference to the measured positions of the peripheral marks, calculating said local positional deviations.

The invention further provides a computer program product comprising instructions for causing a controller of a lithographic apparatus or other patterning device to perform the steps of a method according to the aspects of the invention as set forth above.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 illustrates schematically the mounting of the patterning device and substrate in the apparatus of FIG. 1;

FIG. 3(a) is a schematic view of the layout of the patterning device in the apparatus of FIG. 2, while FIG. 3(b) illustrates the effect of heating and distortion in the patterning device;

FIGS. 4(a) and (b) illustrates the principles of a method according to an embodiment of the invention, in which distortions across the patterning device are estimated from measurements of parts around the periphery of the patterning device;

FIG. 5 is a flow chart illustrating the measurement process according to an embodiment of the invention;

DETAILED DESCRIPTION

Figure 1:
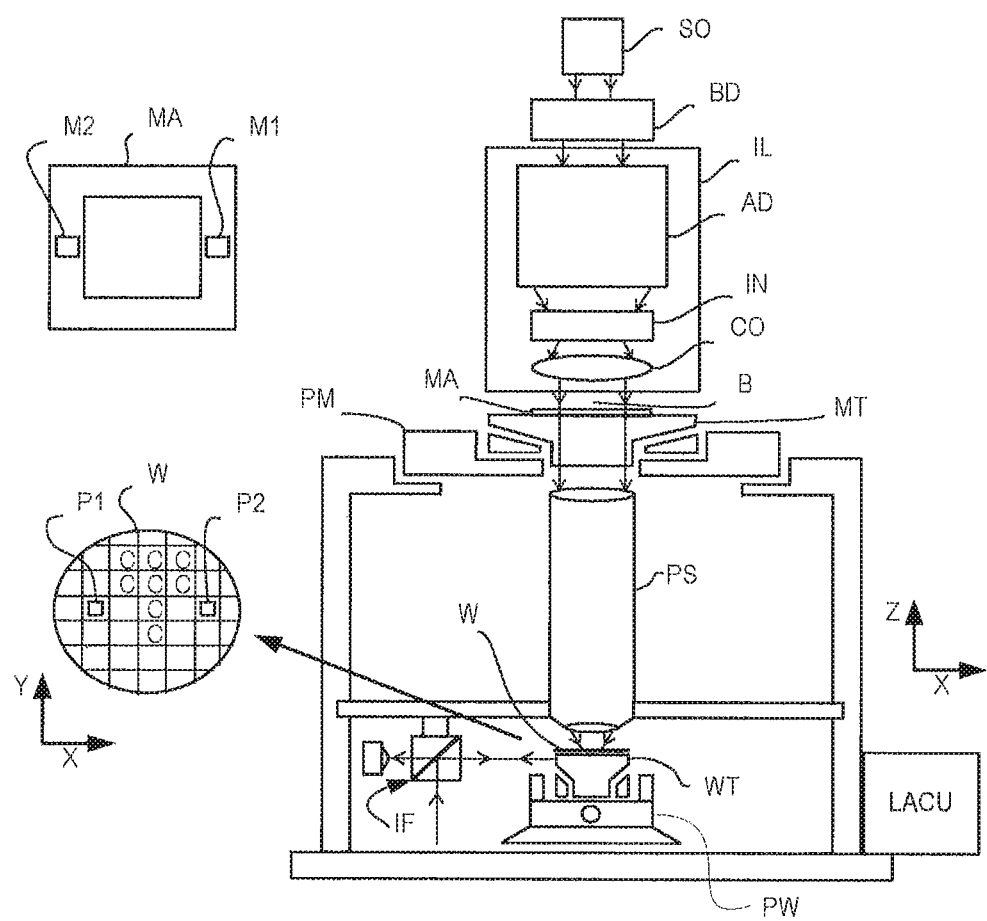
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters;

a projection system (e.g. a refractive projection lens system) PS configured to project a pattern imparted to the radiation beam B by patterning device MA onto a target portion C (e.g. comprising one or more dies) of the substrate W; and a lithography apparatus control unit LACU including programmable processing units and interfaces for controlling and synchronizing the functions of the functional elements listed above.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to readout of the position sensor IF. Overall control of the apparatus may be controlled by a central processing unit, communicating with these sub-systems processing units, with operators and with other apparatuses involved in the lithographic manufacturing process.

The depicted apparatus could be used in at least one of the following modes:
1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2 is a simplified schematic diagram of the apparatus of FIG. 1 showing more clearly the mounting of the patterning device MA and substrate W, for understanding the methods of the present invention. The mask table MT is shown schematically, and connected to a reference frame by the first positioner PM. The positioner operates independently in the X-Y directions (horizontal in the orientation of this diagram), and in the Z direction (vertical). The mounting of components in a high performance lithography apparatus is an extremely complex and challenging problem, as is well understood by the skilled person. In the present example, a simplified version is shown. The patterning device MA (in this case a transmissive mask or reticle 200) is clamped firmly to a moving mask table MT by way of vacuum chucks 202. Vertical supports 204 allow the reticle to be positioned and oriented in the Z direction, while X and Y movements are controlled independently. In practice, positioner PM will comprise coarse and fine control structures, and the portion of the mask table carrying the vacuum chucks 202 may be, for example, a membrane which is flexible in the Z direction but rigid in the X and Y directions.

Referring briefly also to the plan view of FIG. 3(a), the vacuum chucks 202 are shown running along two sides of the reticle area, the reticle being relatively unconstrained at the other two edges. The reticle 200 has light (transparent) and dark (non-transparent) portions 206, 208 respectively, by which a pattern is imparted to the radiation beam B, which originates in the illumination system IL. On the substrate table WT, a substrate W such as a semiconductor wafer with resist coating 210 is supported, and receives the image of the reticle pattern in a scaled down form, via projection system PS. The second positioner PW, which may again comprise coarse and fine positioning mechanisms, controls the X-Y position and the Z position and orientation of substrate W, so that the best possible image is formed in the resist layer 210 and all features of the pattern are applied at the desired position. Apart from the absolute position at which the image is formed, the position of the image relative to features defined in previous exposures is extremely important to the end product. An error in the position in one layer of features on top of another is referred to as an overlay error.

As mentioned already in relation to FIG. 1, various alignment marks and compatible sensors (not shown) are used to ensure correct positioning of the substrate W relative to a reference frame 212, which is very stably positioned relative to reference frame 203 of the first positioner PM. In order to provide alignment of the image of patterning device MA with a reference frame of a substrate W and substrate table WT, various methods can be used. In the present embodiment, an image alignment sensor 220 is provided on a substrate table, with associated electronics 222 feeding signals to processing unit PU which controls the entire apparatus. This sensor is designed to receive radiation focused from compatible alignment marks included in the patterning device MA, so that a reference frame of the two positioners PW and PM can be fixed in relation to one another. Examples of such sensors and corresponding layouts of masks are illustrated in the earlier U.S. application with filing number Ser. No. 12/860,229, not published at the present priority date. That application, the contents of which are incorporated herein by reference, also describes use of the image alignment sensor for measuring distortions due to heating.

FIG. 3 (a) shows a typical patterning device MA in the form of reticle 200 in plan view, with the X and Y axes shown. Reticle 200, which is for example a quartz substrate with a pattern of chrome metal, has a peripheral region 230 surrounding an active (pattern bearing) region 232. Clamping areas in outer parts of peripheral region 230 extend along the two sides, parallel to the Y direction, corresponding to the locations of vacuum chucks 202 indicated by hatched rectangles. Within region 232, one or more device pattern regions 234 are arranged (four in this example). Region 232, when imaged by radiation beam B on the surface of substrate W, will correspond to the area of one target portion C in the illustration of FIG. 1. These target portions are conveniently referred to as fields. Each field typically corresponds to one or more dies that will be cut from the substrate to form individual devices after completion of the lithographic processes. The lithographic apparatus in this example is of the scanning type, mentioned above. A slit-shaped band of illumination S is schematically indicated, moving across reticle 200 in a scanning direction indicated by the large dotted arrows. The scanning direction is parallel to the Y axis, according to convention.

Around and between the device pattern areas 234 there are provided alignment marks and other test and measurement features for control of the lithographic process. Among these features, there are alignment marks 236 which can be of various forms, and need not be of the same form as one another. While they are illustrated as crosses for the sake of illustration, each mark 236 will likely be a composite of several lines and/or grating structures, providing coarse and fine position information in both X and Y directions. Marks 238 can be provided within the active region 232, within the 'scribe lanes' that exist between device regions 234. As space is very much at a premium, it is beneficial if marks can be used for multiple functions.

FIG. 3(b) illustrates the problem of reticle heating which may arise in optical lithography, whether the reticle is transmissive, as in this example, or reflective, as in other embodiments. FIG. 3(b) shows the same reticle 200 as FIG. 3(a) but with detail of the alignment marks removed, for simplicity. Under the influence of the radiation beam B, which is partially absorbed by the reticle 200 during exposures, the material of the reticle will tend to heat up, causing thermal expansion and distortion in three dimensions. The area of heating which is diagonally hatched and labeled 240 extends generally over the whole active region 232. Depending on the distribution of light and dark features in the device regions, there may also be areas of increased local heating, shown cross-hatched and labeled 244, 246. Considering the X and Y directions only (in the plane of the reticle), thermal expansion leads to distortions causing local movement Δx, Δy in the position (x, y) of any point on the reticle. These movements are represented by the arrows distributed across the reticle, though of course these arrows are highly exaggerated in length, compared with the microscopic movements arising in the real example. Because the material is constrained by the vacuum chucks 202 and due to global and local temperature changes (e.g. reticle heating), stresses will arise in the material, and the distortions may be present in three dimensions, not only X and Y. The present disclosure is concerned particularly with overlay errors caused by the in-plane (X, Y) distortions. Other techniques can be applied to correct for Z distortions.

The aim of the invention is to measure, or at least estimate these local distortions so that overlay errors can be reduced during exposure, without excessive impact on apparatus cost and performance. It has been proposed, for example, to embed additional marks within the active region 232, which can be measured to identify the distortions directly. This approach would involve overhead in both time and space on the reticle, however, which are both undesirable. Another suggestion is to measure directly the temperature at local points on the reticle, and calculate corrections from that. This would require additional sensing equipment, leading again to increased apparatus costs and problems of space.

The present application proposes an alternative solution, to estimate local deformations within the reticle by measuring displacements in peripheral region 230, and then by calculation to estimate the deformation at locations of interest within the active region 232. The approach according to one embodiment is firstly to measure positional deviations at different positions around the edge of a reticle, and then to use a back-projection algorithm to reconstruct local deformations of the reticle at locations between the periphery. The peripheral measurements can be done for instance with interferometry, distance sensors, or by measuring the image alignment sensor marks, already present on many reticles. In a known type of apparatus, the image alignment sensor 220 can measure several marks simultaneously, for example the five marks arrayed in the X direction at the top and bottom edges of the reticle shown in FIG. 3(a).

FIGS. 4(a) and (b) illustrate the basis of the back-projection method, which is similar to the reconstruction methods used in computed tomography (CT scanning X-ray machines). In CT scanning, a so-called Radon transform is used, based on the premise that the subject is measured along a series of lines that are diameters of a circle, and observation points step to different angles around the circle. This principle needs to be adapted to the present situation, where the marks are distributed around a rectangular subject, somewhat sparsely.

If n marks are distributed around the periphery of a reticle 200 (n=16 in the illustration), n−1 displacements of the marks, in each direction X and Y, can be measured with appropriate sensors (including in many cases pre-existing sensors, and/or pre-existing marks). Using a back projection approach, the local dilation D(x,y) of a small part of the reticle can be reconstructed by solving a set of integral equations. The distance in x between two example marks Mi and Mj is:

$$xi-xj=\int D(x(s),y(s))e_x ds \qquad (1)$$

where $e_x$ is the unit vector in X, and s is the straight line path connecting mark i and mark j. Some of the lines connecting the peripheral marks on reticle 200 are shown dotted in FIG. 4(a), with a path s between marks Mi and Mj being shown bolder.

By creating equations like Equation (1) above for all pairs of peripheral marks, ½ n(n−1) integral equations are obtained, which can be solved numerically. The same can be done for distances yi−yj in the y direction. The local dilation D(x,y) can then be found by (numerically) solving the equations. The number of paths s between all pairs of marks is very large, even with this small number of marks, and the drawing does not show them all. Only the circled marks are shown with their full set of connecting paths. A simplified calculation example with just eight peripheral marks will be presented below with reference to FIG. 6. In the meantime, the method can be understood by reference to FIG. 4 (b). A convenient way to solve a set of integral equations (1) is to divide the area over which to integrate into sub-areas which we will call cells, and assume a uniform dilation over a cell. In this way the integral can be approximated by the sum of the dilations of the cells through which the line connecting marks Mi and Mj passes.

FIG. 4(b) shows the area of the reticle 200, divided in to an array of rectangular cells 300 for the purposes of the calculation. The peripheral marks 236 form the nodes of some of these cells. Other nodes 302 can optionally be formed at the clamped edge of the reticle, depending how the calculations are designed. A simple implementation uses only the measured peripheral nodes and cells located between them. Nodes and cells outside the measured peripheral nodes can be defined if more sophisticated modeling of the behavior of the reticle is desired. These nodes are not measured, but can be represented as constraints in the sets of equations in which the measurements of the peripheral marks are processed, thereby allowing the designer to model certain physical constraints in the real reticle and its mounting. The division into cells allows the integral equation shown above to be approximated by a summation of dilation values assigned to respective cells. Two example paths s1 and s2 are illustrated, of which s1 is the same path s highlighted in FIG. 4(a). Cells which are traversed by path s1 are hatched diagonally in one direction, while cells traversed by path s2 are hatched diagonally in the opposite direction. A cell which is traversed by both paths is cross-hatched. Since there are in fact ½ n(n−1) such paths that can be considered, every cell features in a sufficient number of paths s that its individual dilation can be calculated from the relative displacements of the peripheral mark pairs. Locations within the pattern regions 234 do not need to be measured directly, to obtain useful estimates of local positional deviations anywhere within the area surrounded by the peripheral marks.

Shown in the lower portion of FIG. 4(b) is the process of using the calculated cell dilations to obtain a position for an individual cell, marked 'x'. Starting from the measured positions of a number of peripheral marks 236, paths can be plotted as shown by the arrows, adding together the dilations of the cells traversed to the cell of interest. The traversed cells are marked by dots on the arrows which represent the paths. The full set of paths need not be used: in principle one path will provide both X and Y displacement of a cell. However, it will be better to use at least two paths oriented orthogonal to one another, and perhaps more than two, and use an average of the results. In a case where it is desired to know a parameter of the distortion, rather than the displacement of a specific point, calculations may be made so as to arrive directly at that parameter, rather than via the specific displacements. For example, in the embodiments used in a scanning type lithographic apparatus, it may be desired to know the average Y displacement or X dilation for a strip of cells, corresponding to an illuminated strip of the reticle. In an embodiment where the control unit is arranged to receive corrections in the form of higher order polynomials (3rd, 5th order, for example) it may be convenient if the appropriate higher order polynomial curves are fitted to the dilations estimated by the back-projection method. The calculations can be expressed in a form which gets from the peripheral mark positions directly to the parameters of these polynomials, which will then be in a form which can be readily interpreted and applied by the control unit. Unnecessary computations will be avoided.

Referring to the flowchart of FIG. 5, the basic measurement process is illustrated, using the principles described above with reference to FIGS. 3 and 4. At 500, a reticle with peripheral marks, device patterns and other alignment/metrology features is loaded onto the patterning device support MT, and clamped by vacuum chucks 202. At 502, the positions of the peripheral marks are measured as a reference for future use. These positions may also be used, for example, to identify deformations of the reticle caused by clamping, in the manner of U.S. Pat. No. 6,277,532, mentioned above. If the same peripheral marks serve as part of the "normal" alignment marks, these measurements may be used also for setting up the exposure process generally.

After a period of time, particularly a period of exposure operations in which reticle heating might occur, at step 504 the positions of the peripheral marks are again measured. These are compared with the reference positions measured at step 502, to identify deviations in the positions of the marks. These deviations may be recorded as separate Δx and Δy values for each mark, for example. Alternatively, the deviations in x and y for each mark pair (each path) may be calculated immediately and stored instead. At step 506, using a back projection method, the individual dilations of cell areas within the active region 232 are obtained. To do this, a complete set or a sufficient subset, of equations of the type described with reference to FIG. 4 are created, and solved to obtain the individual dilations of each cell.

At step 508, the calculated cell dilations are then applied to obtain the estimated position or deviation at one or more points of interest across the area of the reticle. At step 510, these local positional deviations are applied in the control of exposure operations, so that the positioning of a pattern from the reticle at a desired position on the substrate W is corrected for the positional deviations caused by heating. In the case of scanning exposures, the apparatus can be controlled to vary the relative X and Y positions of the reticle and substrate, and also to vary magnification of the projection system PS, so as to improve matching the positions of device features on the reticle pattern and features already present on the substrate from previous exposures. Optionally, mechanical and/or thermal energy can be directed at parts of the reticle so as to counter the thermal distortion actively. The aim of such measures may be to reduce the amount of distortion overall, or simply to redistribute the distortion to a shape that can be more effectively or more easily corrected using the available control parameters of the particular lithographic apparatus. For example, in U.S. Pat. No. 7,683,351 there is described a technique in which the control system of a scanning type lithographic apparatus is configured to correct a local distortion of the image in a region along the scan path by a temporal adjustment of the image in that region. By occasional measurement and feedback of the measured distortion to control the application of additional heat, the shape of the distortions can be maintained in a form that is amenable to such a correction method, or any other correction method available.

Figure 6A:
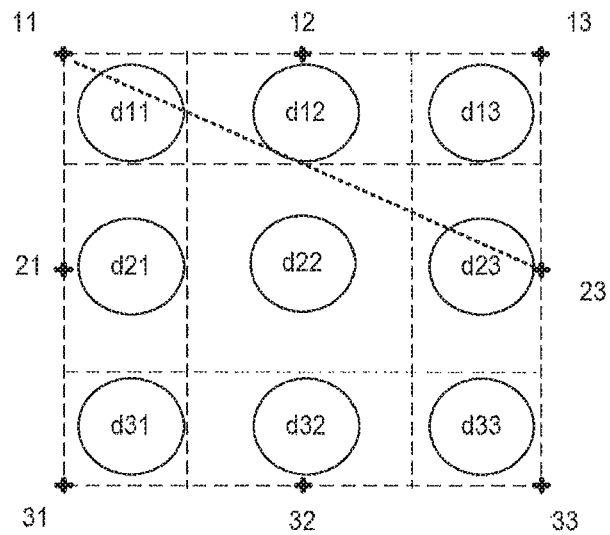
FIGS. 6(a) and (b) illustrate different forms of equation that may be used in a back projection method according to an embodiment of the invention.

FIG. 6 illustrates some alternative approaches to the calculation of the integral equations, for a simple example of nine cells surrounded by eight peripheral marks. Different subdivisions can be made. Using indices 1, 2, 3 for the rows and columns, peripheral marks can be identified by the same indices labeled 11 to 13 along the top edge, 13 to 33 down the right hand edge and so forth. The measured position of each mark, in a given direction, will be represented by the letter e with the notation e11, e12 etc. identifying the mark to which the measurement relates. Each cell has a dilation d (in each of X and Y), representing its thermal expansion or contraction (assuming that temperatures rise, contraction will generally occur under the influence of neighboring cells expanding). The dilations may be expressed in differential form, relative to some initial positions, recorded separately, but this is not necessary. Dilations d11 to d13 are experienced by cells in the first row, for example. Integrals relating the edge positions e to the dilations d can be defined for paths joining up to 28 different pairs of marks: six paths along horizontal edges (two full length and four shorter), six paths along vertical edges, one central horizontal path, one central vertical path, six 1:1 diagonals, four 2:1 diagonals and four 1:2 diagonals. (The ratio 1:1, 1:2 etc. refers to the gradient of the diagonals, i.e. the number of steps across against the number of steps down. The path 11-23 highlighted by a dashed line is a 2:1 diagonal.) Each integral is in principle the sum of the dilations of three cells, so for example the 1:1 diagonal path from mark 11 to 33 defines an approximation to the integral as:

$$e11 - e33 = d11 + d22 + d33 \qquad (2)$$

Some paths, such as the 2:1 gradient diagonal path from mark 11 to mark 23 which is highlighted in the drawing, pass through more than three cells, and pass more centrally through some cells than others. Equation (3) illustrates one way of calculating the integral along a 2:1 diagonal path from mark 11 to mark 23:

$$e11 - e23 = d11 + \tfrac{1}{2}d12 + \tfrac{1}{2}d22 + d23 \qquad (3)$$

In this method, the dilations for cells 12 and 22 are added to the integral with a half weighting each, reflecting the fact that the path effectively straddles the boundary between two cells. The same principle can be applied to all other paths. If desired, lower weightings could also be given to the corner and edge cells (11 and 23 in the case of the highlighted path) to reflect that they are smaller, in this particular scheme of dividing the reticle area into cells.

Figure 6B:
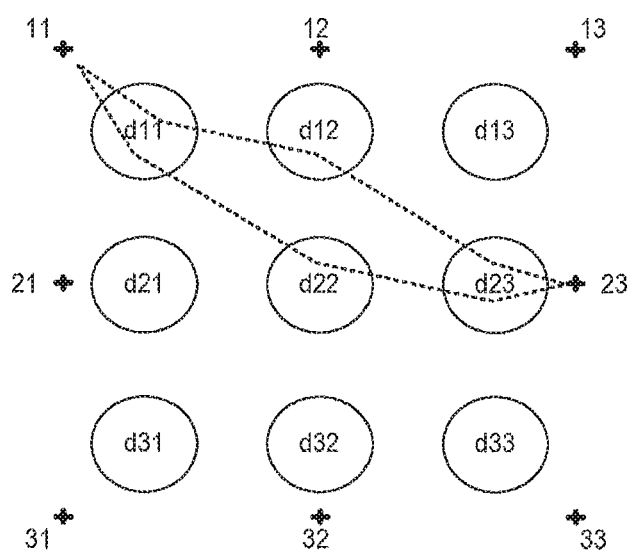

FIG. 6(b) illustrates another method of approximating the integral, in which each cell is treated as a node in a network, two alternative paths are followed, and the results summed:

$$2(e11-e23)=(d11+d12+d23)+(d11+d22+d23) \quad (4)$$

Many other formulations are possible for what is, after all, only an approximation to the ideal continuous integral. Because there are nine cells whose dilations are unknown, and sixteen path integrals which feature those cells, the set of equations is over-determined and can be solved automatically. Having more equations than there are variables (an over-determined system) reduces noise in the cell dilation estimates. The solution of such a set of equations is unique. There are standard numerical routines described in textbooks on numerical methods to solve over-determined sets of linear equations in a fast and robust manner. Examples are Gramm-Schmidt orthogonalization and singular value decomposition. Note that the solution is directly calculated from measurements, and is not an iterative process in the manner of, for, example, finite element analysis. The model implemented by the back projection algorithm does not rely on modeling thermal behavior of the reticle material as such, only the mechanical distortions which have actually occurred at the time when the peripheral marks are measured are taken into account. Any desired accuracy can be achieved by increasing the number of peripheral marks and consequently making the cells smaller. The weighting given to each cell's dilation in the integral can be determined with greater or lesser subtlety, as desired. Values may be weighted according to the length of the path within each rectangular cell (cells do not need to be rectangular, of course). Values may be weighted according to how close the path comes to a central point of the cell.

Figure 7:
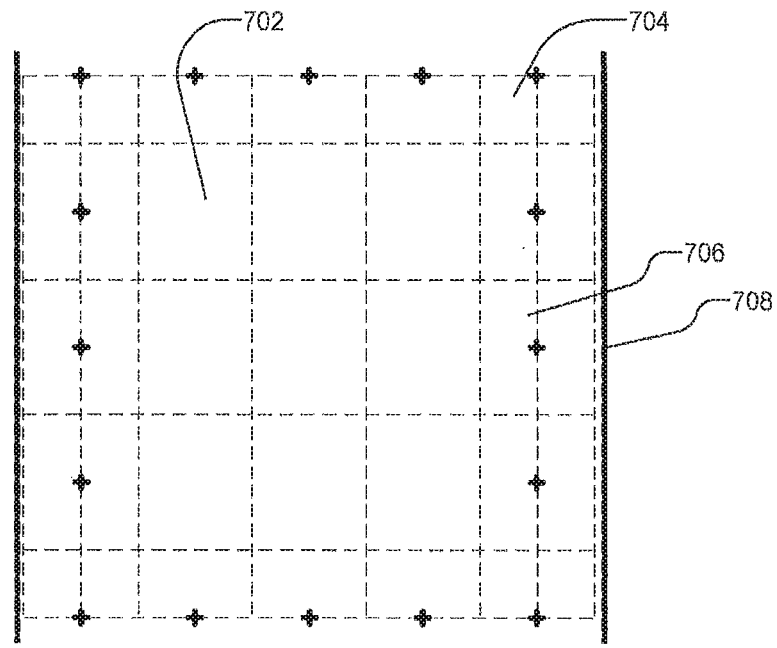
FIG. 7 illustrates the division of a patterning device area into cells of different sizes, according to an alternative embodiment of the invention.

FIG. 7 illustrates another example of the division of the active region and peripheral region of a reticle into cells suitable for estimating the thermal dilation of portions of the reticle. Different weightings of the cell dilation values can be applied to different cells, in recognition of differences in their geometric, mechanical and/or thermal interrelationships. For example, cells 702 are within the body of the reticle and constrained on all sides by other cells, cells 704 are subject to reduced constraints because they are at (near) the free edge of the reticle, while cells 706 may be subject to increased constraints because they are near the clamped portion, represented in this model by line 708.

Where marks are present also within the active region 232, as in the case of mark 238 in FIG. 3, these intermediate marks can be measured and additional paths may be defined to further improve accuracy.

Figure 8:
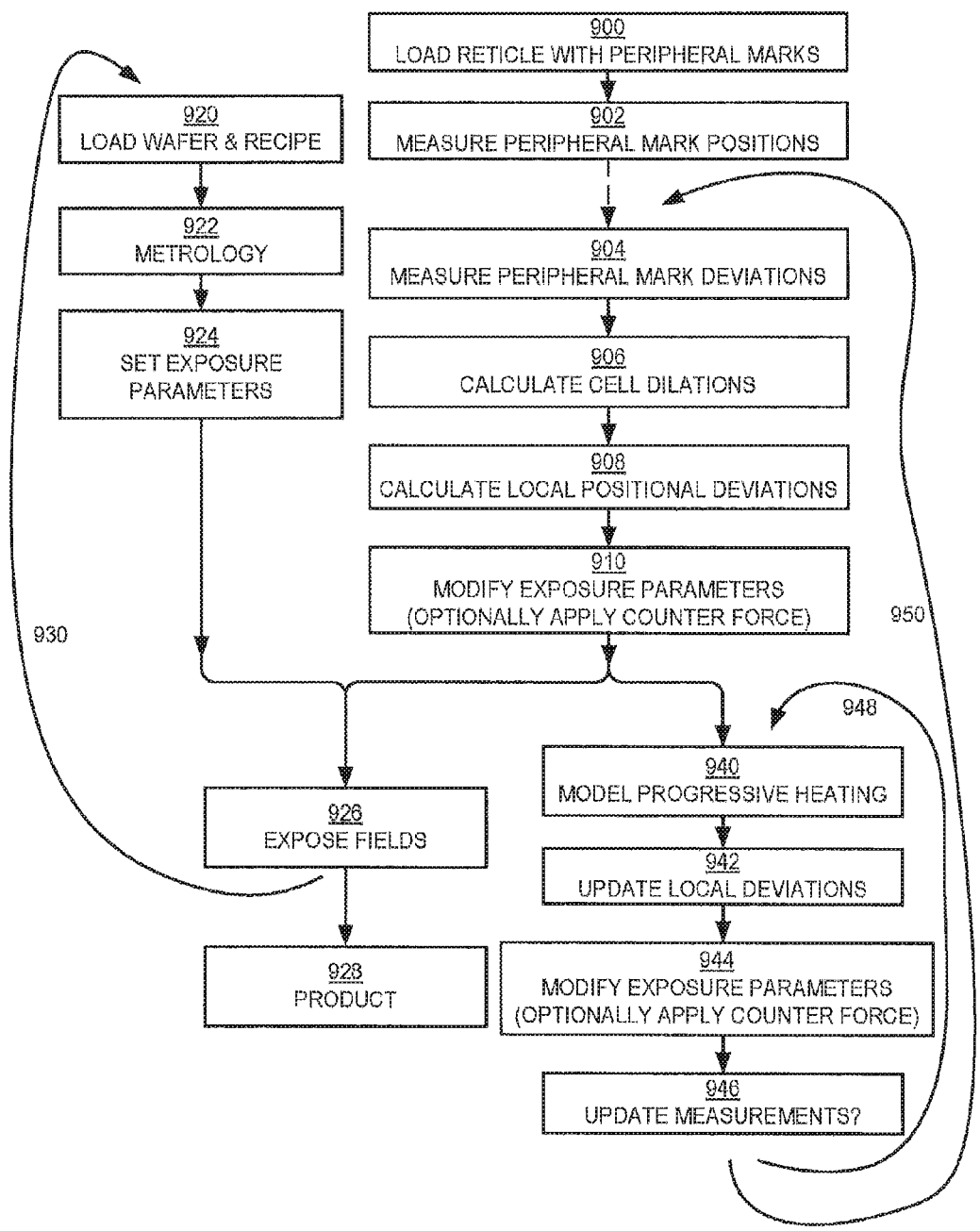
FIG. 8 is a flowchart showing an embodiment of the method of the invention applied during a lithographic manufacturing process.

In the method of FIG. 8, steps 900-910 are the same as the like-numbered steps 500-510 in the basic method of FIG. 5. Additional steps show the context of performance of the method, which happens in parallel with the lithographic manufacturing process. In this manufacturing process, substrate W (a semiconductor wafer or other substrate) is loaded into the lithography apparatus as step 920. Together with the substrate, a "recipe" of process parameters is received by control unit LACU, according to which the apparatus will be set up and operated. Some parameters may be set for a batch of similar substrates, other parameters may be specific to an individual substrate. At step 922, metrology functions are performed as described above with reference to FIG. 1, to measure the exact position of the substrate and align it with the projection system PS. The X, Y position and height (Z) position are mapped with a desired resolution and accuracy across the surface of the substrate. The metrology results are stored by the control unit for use in controlling exposure operations. At 924, exposure parameters are set in accordance with the recipe and the metrology results. At 926, the exposure process proceeds, typically by exposing successive fields (target portions C in FIG. 1) with the beam B of radiation patterned by the patterning device MA. At step 928, the patterned product substrate is ejected and at 930 a next substrate is loaded, by returning to step 920.

The interruption resulting from the execution of metrology step 922 is reduced in some embodiments by use of a dual stage arrangement, in which two substrate tables WT are provided. In this way, the majority of measurements performed on each new substrate can be performed at a location away from the exposure station on the first substrate table WT, while exposure of a previous substrate is in progress on the second substrate table. When the first substrate table is swapped into position beneath the projection system PS, only a few measurements are required to complete the alignment process for the new substrate. The present invention is applicable whether a dual stage operation or some other arrangement is applied.

As illustrated, the steps 904-910 which monitor the distortion of the reticle and modify the exposure parameters accordingly, are performed to some extent in parallel with the exposure operations 924, 926 as just described. In practice, it is not desired to measure reticle distortion between every exposure, as this would harm throughput. Moreover, the heating and consequent distortion of the reticle may vary quite slowly during normal operation, in which case frequent measurement would be pointless. Therefore, in this practical embodiment, the peripheral mark deviations are measured only intermittently, when throughput will not be unduly affected. The progressive heating of the reticle or other patterning device MA can be modeled if necessary, so that deviations between measurements can be interpolated to a reasonable level of accuracy. Accordingly, in parallel with the exposure of multiple target portions in step 926, a step 940 is performed to model the progressive heating in accordance with the number of exposures and model parameters obtained from experience. At 942 the local positional deviations calculated at 908 are updated in accordance with the predictions of the model. At 944 the exposure parameters are modified in accordance with the updated local deviations.

At 946, a decision is made whether to update measurements of the peripheral mark deviations, or to continue estimating using the model without new measurements. Path 948 is chosen in the latter case, while path 950 is chosen on occasion, and a new measurement of the peripheral marked deviations is made. Noting that many metrology steps are performed with the loading of a new substrate (step 922), it is relatively easy to update the peripheral mark deviation measurements on the reticle at the time of loading a new substrate. Where the same marks are used for the reticle distortion measurements as for the more "normal" reticle-substrate alignment processes, the actual measurement overhead can be very little. In such a case, the process of steps 900-910 and 940-948 represents only a processing overhead, for example requiring additional operations in the existing control unit LACU. In a given implementation, of course, it is permissible to update the measurements at other instances, including between the exposures of different target portions (fields), where the gain in alignment accuracy of the exposed pattern justifies the throughput penalty.

Figure 9:
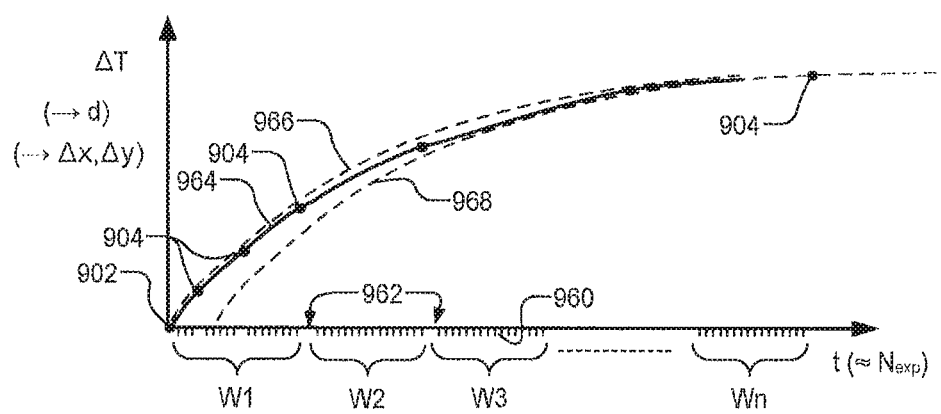
FIG. 9 is a graph showing schematically a temperature profile of a patterning device undergoing heating during operation of the apparatus of FIGS. 1 and 2.

FIG. 9 is a graph illustrating the progression of heating in a typical substrate, during performance of the process of FIG. 8. The vertical axis represents a rise in temperature ΔT on an arbitrary scale. As noted in parenthesis, the temperature rise relates also roughly in proportion to changes in dilation D and consequent positional deviations Δx, Δy. As noted already, the temperature rise may be different at different parts of the reticle, but the general form of the curve should remain the same.

On the horizontal axis, time is represented, which also corresponds very broadly to the number of exposures, labeled $N_{exp}$. Along the bottom of the horizontal axis, a number of "ticks" 960 represent individual exposures of target portions (fields) for a succession of substrates labeled W1, W2, W3 etc. In the simple operating routine illustrated, the time axis shows interruptions 962 in the sequence of exposures, every time a new substrate is loaded. These interruptions correspond to the act of physically loading the substrate (and removing the previous one if applicable) which is performed at step 920 in the flowchart of FIG. 8, as well as the metrology step 922. The interruptions are not shown to scale, nor is the number of exposure "ticks" 960 meant to represent a particular example.

On the graph shown in FIG. 9, the solid curve 964 represents the actual temperature profile of a portion of the reticle over time. As can be seen, a typical reticle will exhibit a rise in temperature over many exposure operations, gradually reaching a steady state after a number of exposures and wafer loading operations. Needless to say, the exact value of the time constant, and its relation to the number of exposures and the number of wafers exposed depends heavily on the exact details of the lithographic process, including the energy in the illumination beam, the absorption of the particular type of reticle and the nature of the pattern applied, the heat capacity of the reticle material and the speed of operations. The dotted curve 966 illustrates a theoretical heating profile that models what might be expected if exposures were to continue continuously, without interruptions for metrology, changes of substrate etc. The real curve 964 follows generally this profile, but is depressed slightly due to the interruptions which occur from time to time. The real curve therefore ends up following a slightly delayed version of the model curve 966, represented by a second dotted curve 968.

On the curve 964, dots 902 and 904 are marked, at occasions where real measurements of the peripheral mark deviations are taken, and the calculated local deviations are updated, using the method of steps 902-910. Between these measurements, as described already, a model of the heating behavior is applied to update the local deviations. It is a matter of design choice, how sophisticated this model is. Based on measurements of actual reticle heating, and/or measurements of actual reticle distortion, the curve 966 can be represented by a number of parameters, which are then used to integrate the number of exposures and will track reasonably closely the real curve 964. Whenever real measurements are made (904) the model can be updated, and, if desired, the parameters used for modeling can be adapted to improve modeling in subsequent wafers, batches etc. In the early stages of operation, the temperature rise is fastest, and additional measurements 904 may be made, as illustrated during the exposure of substrate W1. Depending on the time taken for the measurement, some interruption and throughput penalty may be experienced. It is an option to measure only some of the peripheral mark deviations during these intermediate measurements, and to use these results to calculate interpolated values of the dilations, even if the full calculation is not made.

For a given reticle, the model parameters can be estimated based on its design, and then updated based on experience during actual exposures. Alternatively, where the accuracy is sufficient, a single model can be used for all reticles, or for reticles of a general type. These are matters of detailed implementation, all within the capabilities of the skilled person.

Figure 10:
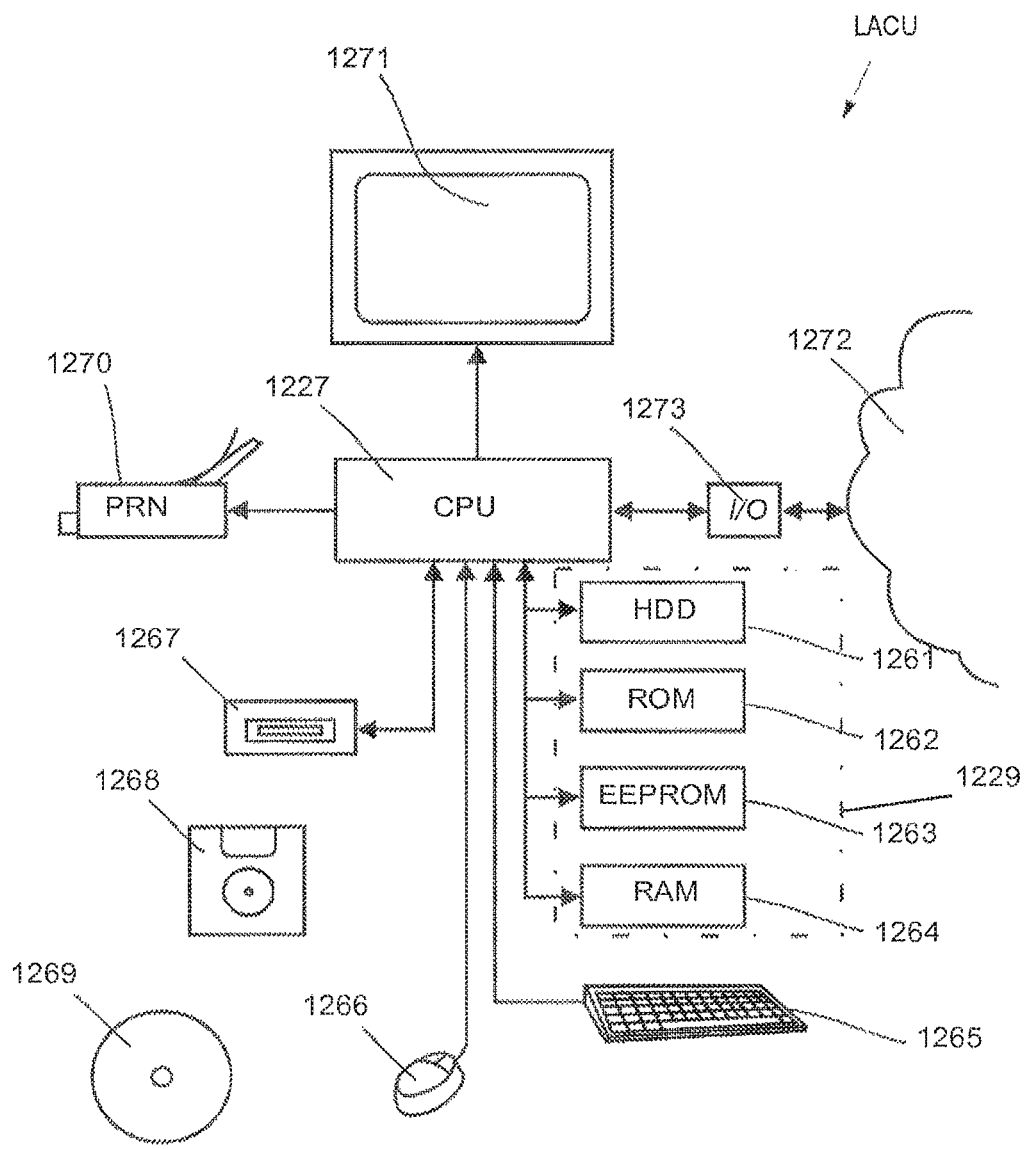
FIG. 10 illustrates an embodiment of the processing unit in the apparatus of FIGS. 1 and 2.

It should be understood that the invention as described may be implemented in existing apparatus using suitable programming of the lithography control unit LACU. Control unit LACU may be based on a computer assembly as shown in FIG. 10. The computer assembly may be a dedicated computer in the form of a control unit in embodiments of the assembly according to the invention or, alternatively, be a central computer controlling the lithographic apparatus. The computer assembly may be arranged for loading a computer program product comprising computer executable code. This may enable the computer assembly, when the computer program product is downloaded, to implement the novel operations of the lithographic apparatus, in accordance with the methods described above.

Memory 1229 connected to processor 1227 may comprise a number of memory components like a hard disk 1261, Read Only Memory (ROM) 1262, Electrically Erasable Programmable Read Only Memory (EEPROM) 1263 and Random Access Memory (RAM) 1264. Not all aforementioned memory components need to be present. Furthermore, it is not essential that aforementioned memory components are physically in close proximity to the processor 1227 or to each other. They may be located at a distance away The processor 1227 may also be connected to some kind of user interface, for instance a keyboard 1265 or a mouse 1266. A touch screen, track ball, speech converter or other interfaces that are known to persons skilled in the art may also be used.

The processor 1227 may be connected to a reading unit 1267, which is arranged to read data, e.g. in the form of computer executable code, from and under some circumstances store data on a data carrier, like a removable disc 1268 or a CDROM 1269. Also DVD's or other data carriers known to persons skilled in the art may be used.

The processor 1227 may also be connected to a printer 1270 to print out output data on paper as well as to a display 1271, for instance a monitor or LCD (Liquid Crystal Display), or any other type of display known to a person skilled in the art.

The processor 1227 may be connected to a communications network 1272, for instance a public switched telephone network (PSTN), a local area network (LAN), a wide area network (WAN) etc. by way of transmitters/receivers 1273 responsible for input/output (I/O). The processor 1227 may be arranged to communicate with other communication systems via the communications network 1272. In an embodiment of the invention external computers (not shown), for instance personal computers of operators, can log into the processor 1227 via the communications network 1272.

The processor 1227 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1227 may even be located a distance away of the other processing units and communicate via communications network 1272. Separate processing units external to the lithographic apparatus may be used for process modifications such as the one described here.

In an embodiment, there is provided a method of operating a patterning device, the patterning device having a patterned portion which in operation is illuminated with a radiation beam so as to impart a pattern to the radiation beam in its cross-section, the method comprising: (a) providing a plurality of reference marks distributed around the patterned portion in a peripheral portion of the patterning device and measuring positions of said marks relative to one another; (b) after a period of operation of the patterning device, measuring again the positions of said peripheral marks; (c) by reference to the measured positions of the peripheral marks, calculating local positional deviations induced by thermal heating of the patterning device by said radiation beam at one or more positions of interest within the patterned portion of the patterning device.

In an embodiment, the calculating comprises: (c1) selecting pairs of the peripheral marks so as to define a set of lines crossing the patterned portion so that, for a plurality of sub-areas within said patterned portion, each sub-area is crossed by more than one of said lines; (c2) solving a system of equations to calculate a dilation of each sub-area, each equation relating measured positional deviations between the marks at the ends of each of said lines to dilations of the sub-areas positioned along said line; and (c3) calculating the local positional deviations at said positions of interest by combining calculated dilations for sub-areas between at least one measured peripheral mark and the position of interest. In an embodiment, the method further comprises an exposure step (d) of exposing a target portion of a substrate to said patterned radiation beam so as to apply a pattern from the patterning device to the substrate by a lithographic process. In an embodiment, the exposing is repeated to apply said pattern to a succession of target portions on one or more substrates, without repeating the measuring and calculating every exposure. In an embodiment, the exposing is performed several times for each of a succession of substrates loaded into a lithographic apparatus, and the measuring and calculating are performed when a new substrate is loaded into the apparatus. In an embodiment, the exposing includes modifying at least one parameter of the exposing in accordance with the result of the calculating, in order to reduce overlay error between the applied pattern and a pattern existing on the substrate. In an embodiment, the exposing includes applying energy to the patterning device to reduce or modify a distribution of the local positional deviations for subsequent exposures. In an embodiment, an interval between the measuring and the calculating becomes longer as a number of exposures performed in succession increases. In an embodiment, the method further comprises updating the calculated positional deviations between measurements, in accordance with a predicted progression of thermal heating. In an embodiment, the patterned portion of the patterning device is generally rectangular in extent and said peripheral marks are distributed along all four sides of a rectangle. In an embodiment, the local positional deviations calculated in the calculating are represented indirectly by distortion parameters compatible with control parameters of a lithographic apparatus in which the patterning device is employed. In an embodiment, the patterning device is provided with further marks within the patterned portion, the further marks being included in the measuring and the calculating. In an embodiment, the measuring and the calculating are repeated at intervals, the further marks being measured less frequently than the peripheral marks.

In an embodiment, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a controller arranged to control movements of said substrate table, and said patterning device relative to one another and to said projection system in order to perform a succession of exposure operations, each exposure operation applying the pattern to a target portion on the substrate, wherein the controller is arranged to measure, before and after a number of exposure operations, the relative positions of a plurality of reference marks distributed in a peripheral portion of the patterning device and from said measurements of the peripheral marks to estimate local positional deviations induced by thermal heating of the patterning device by said radiation beam at one or more positions of interest within the patterned portion of the patterning device, and to modify one or more parameters of subsequent exposure operations in accordance with the estimated positional deviation.

In an embodiment, the controller is arranged to estimate said local positional deviations by: selecting pairs of the peripheral marks so as to define a set of lines crossing the patterned portion so that, for a plurality of sub-areas within said patterned portion, each sub-area is crossed by more than one of said lines; solving a system of equations to calculate a dilation of each sub-area, each equation relating measured positional deviations between the marks at the ends of each of said lines to dilations of the sub-areas positioned along said line; and calculating the local positional deviations at said positions of interest by combining calculated dilations for sub-areas between at least one measured peripheral mark and the position of interest. In an embodiment, the controller is arranged to repeat the measurement of at least a subset of said peripheral marks and to update the estimated local positional deviations when a new substrate is loaded into the apparatus. In an embodiment, the controller is arranged to repeat the measurement of at least a subset of said peripheral marks at the same time as measuring positions of marks for aligning the patterning device and substrate. In an embodiment, the controller is arranged to use at least some of the same measurements of peripheral marks for aligning the patterning device and substrate. In an embodiment, the apparatus further includes an arrangement for applying energy to the patterning device to reduce or modify a distribution of the local positional deviations for subsequent exposures. In an embodiment, the controller is arranged to update the estimated local positional deviations between measurements, in accordance with a predicted progression of thermal heating.

It is observed that, although all connections in the drawing are shown as physical connections, one or more of these connections can be made wireless. They are only intended to show that "connected" units are arranged to communicate with one another in some way. The computer system can be any signal processing system with analogue and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method comprising:
   measuring each of a plurality of locations on a patterning device having a patterned portion which in operation is illuminated with a radiation beam so as to impart a pattern to the radiation beam in its cross-section, the locations distributed around the patterned portion in a peripheral portion of the patterning device, wherein pairs of the locations define a set of lines crossing the patterned portion;
   after a period of operation of the patterning device, measuring again the locations; and
   by solving a system of equations, each equation relating results from the measuring in respect of the pair of locations at the ends of a respective line to a position or deviation of a location positioned along the line, calculating a value for a sub-area or point of interest within the patterned portion that has shifted due to thermal heating of the patterning device.

2. The method of claim 1, wherein, for a plurality of sub-areas within the patterned portion, each sub-area is crossed by more than one of the lines.

3. The method of claim 1, wherein the solving the system of equations comprises solving a system of equations to calculate a dilation of each of a plurality of regions, each equation relating results from the measuring in respect of the pair of locations at the ends of a respective line to dilations of one or more of the regions positioned along the line; and wherein the calculating comprises calculating the value by combining calculated dilations for regions between at least one of the locations and the sub-area or point of interest.

4. The method of claim 1, further comprising updating the calculated value between measurements, in accordance with a mathematical model of predicted future progression of thermal heating.

5. The method of claim 1, wherein the value is a value of a parameter of a polynomial that describes at least part of the patterned portion or that describes a correction.

6. The method of claim 1, further comprising exposing a target portion of a substrate to the patterned radiation beam so as to apply a pattern from the patterning device to the substrate by a lithographic process and wherein the exposing is repeated to apply the pattern to a succession of target portions on one or more substrates, without repeating the measuring and calculating every exposure.

7. The method of claim 6, wherein the exposing is performed several times for each of a succession of substrates loaded into a lithographic apparatus, and the measuring and calculating are performed when a new substrate is loaded into the apparatus.

8. The method of claim 1, further comprising exposing a target portion of a substrate to the patterned radiation beam so as to apply a pattern from the patterning device to the substrate by a lithographic process and wherein the exposing includes modifying at least one parameter of the exposing in accordance with the result of the calculating, in order to reduce overlay error between the applied pattern and a pattern existing on the substrate.

9. The method of claim 1, wherein the patterned portion of the patterning device is generally rectangular in extent and the locations are distributed along all four sides of the patterned portion.

10. The method of claim 1, wherein the patterning device is provided with marks within the patterned portion, the marks being included in the measuring and the calculating.

11. The method of claim 10, wherein the marks are measured less frequently than the locations.

12. The non-transitory computer-readable medium of claim 11, wherein the instructions are further configured to cause the computing system to update the calculated value between measurements, in accordance with a mathematical model of predicted future progression of thermal heating.

13. The non-transitory computer-readable medium of claim 11, wherein the value is a value of a parameter of a polynomial that describes at least part of the patterned portion or that describes a correction.

14. The non-transitory computer-readable medium of claim 11, wherein the patterned portion of the patterning device is generally rectangular in extent and the locations are distributed along all four sides of the patterned portion.

15. A non-transitory computer-readable medium comprising instructions to cause a hardware computing system to cause:

measurement of each of a plurality of locations on a patterning device having a patterned portion which in operation is illuminated with a radiation beam so as to impart a pattern to the radiation beam in its cross-section, the locations distributed around the patterned portion in a peripheral portion of the patterning device, wherein pairs of the locations define a set of lines crossing the patterned portion;

after a period of operation of the patterning device, measurement again of the locations; and by solving a system of equations, each equation relating results from the measurements in respect of the pair of locations at the ends of a respective line to a position or deviation of a location positioned along the line, calculate a value for a sub-area or point of interest within the patterned portion that has shifted due to thermal heating of the patterning device.

16. The non-transitory computer-readable medium of claim 15, wherein, for a plurality of sub-areas within the patterned portion, each sub-area is crossed by more than one of the lines.

17. The non-transitory computer-readable medium of claim 15, wherein the solving the system of equations comprises solving a system of equations to calculate a dilation of each of a plurality of regions, each equation relating results from the measuring in respect of the pair of locations at the ends of a respective line to dilations of one or more of the regions positioned along the line; and wherein the calculation comprises calculation of the value by combining calculated dilations for regions between at least one of the locations and the sub-area or point of interest.

18. A lithographic apparatus comprising:
a support constructed to support a patterning device, the patterning device being capable of imparting a radiation beam with a pattern in its cross-section to form a patterned beam;
a substrate table constructed to hold a substrate;
a projection system configured to project the patterned radiation beam onto a target portion of the substrate; and
a control system comprising the non-transitory computer-readable medium of claim 15.

19. A non-transitory computer-readable medium comprising instructions to cause a hardware computing system to:
by reference to a set of measurement data of a patterning device having a patterned portion which in operation is illuminated with a radiation beam so as to impart a pattern to the radiation beam in its cross-section, calculate a value corresponding to a position or area of interest, within the patterned portion, that has shifted by thermal heating of the patterning device by the radiation beam;
repeat the calculation a plurality of times, each calculation occurring after a period of operation of the patterning device and using a different set of measurement data; and
based on a mathematical model of predicted future progression of thermal heating, update the calculated value, separately from the calculating the value the plurality of times, between successive measurements of the patterning device used to obtain the sets of measurement data such that the updated value can be used in modifying a parameter of an exposure operation between the successive measurements.

20. The non-transitory computer-readable medium of claim 19, wherein the value is a value of a local position or deviation of the position or area of interest, or a value of a parameter of a polynomial that describes at least part of the patterned portion or that describes a correction.

* * * * *